(12) United States Patent
Kim et al.

(10) Patent No.: US 9,299,604 B2
(45) Date of Patent: Mar. 29, 2016

(54) SEMICONDUCTOR DEVICE AND METHOD FOR MANUFACTURING THE SAME

(71) Applicant: SK HYNIX INC., Icheon (KR)

(72) Inventors: Jeong Youl Kim, Icheon (KR); Ki Soo Choi, Cheongju (KR)

(73) Assignee: SK HYNIX INC., Icheon (KR)

(*) Notice: Subject to any disclaimer, the term of this patent is extended or adjusted under 35 U.S.C. 154(b) by 0 days.

(21) Appl. No.: 14/458,007

(22) Filed: Aug. 12, 2014

(65) Prior Publication Data

US 2014/0349474 A1 Nov. 27, 2014

Related U.S. Application Data

(62) Division of application No. 13/719,064, filed on Dec. 18, 2012, now Pat. No. 8,836,077.

(30) Foreign Application Priority Data

Jul. 16, 2012 (KR) ........................ 10-2012-0077255

(51) Int. Cl.
*H01L 21/44* (2006.01)
*H01L 21/768* (2006.01)
*H01L 23/525* (2006.01)

(52) U.S. Cl.
CPC .... *H01L 21/76832* (2013.01); *H01L 21/76879* (2013.01); *H01L 21/76894* (2013.01); *H01L 23/525* (2013.01); *H01L 23/5258* (2013.01); *H01L 2924/0002* (2013.01)

(58) Field of Classification Search
CPC ................... H01L 21/76879; H01L 21/76894; H01L 21/76832; H01L 23/5258; H01L 23/525
See application file for complete search history.

(56) References Cited

U.S. PATENT DOCUMENTS

| 5,972,756 A | * | 10/1999 | Kono et al. | ......... | H01L 23/5258 |
| | | | | | 257/E21.019 |
| 7,470,590 B2 | * | 12/2008 | Juengling et al. | ... | H01L 23/5256 |
| | | | | | 257/E23.149 |
| 2002/0111004 A1 | * | 8/2002 | Suzuki et al. | ................. | 438/601 |
| 2011/0024872 A1 | * | 2/2011 | Kim | ............................. | 257/529 |

FOREIGN PATENT DOCUMENTS

KR  10-2005-0078910 A   8/2005
KR    10-0681676 B1     2/2007

* cited by examiner

*Primary Examiner* — A. Sefer

(57) ABSTRACT

A semiconductor device according to an embodiment of the present invention includes fuse patterns spaced apart from each other by a predetermined distance over a first interlayer insulation film; a second interlayer insulation film disposed between the fuse patterns over the first interlayer insulation film; and a capping film pattern formed over the fuse patterns and the second interlayer insulation films, the capping film pattern including a slot exposing the second interlayer insulation film.

16 Claims, 4 Drawing Sheets

SEMICONDUCTOR DEVICE AND METHOD FOR MANUFACTURING THE SAME

CROSS-REFERENCE TO RELATED APPLICATION

The present application is a divisional of U.S. patent application Ser. No. 13/719,064, filed on Dec. 18, 2012, which claims priority of Korean patent application No. 10-2012-0077255 filed on 16 Jul. 2012, which are incorporated by reference in their entirety.

BACKGROUND OF THE INVENTION

Embodiments of the present invention relate to a semiconductor device and a method for manufacturing the same, and more particularly to a semiconductor device in which a capping film pattern including a slot is formed over a fuse pattern to prevent a crack from occurring in the capping film pattern, which may prevent defects caused by copper migration and oxidation.

If a defective or failed part occurs in one of the numerous cells contained in a semiconductor memory device, a test may determine that the memory is defective. Even though failures may only occur in a fraction of the cells of the semiconductor memory device, the entire semiconductor memory device is discarded as a defective product, so production yield is detrimentally impacted. In order to solve the above-mentioned problem, a repair process may be performed in which a defective cell is replaced with a redundant cell in the semiconductor memory device, the entire semiconductor memory device can be recovered, resulting in increased production yield. In order to replace a defective cell with a redundant cell, the semiconductor memory device includes a fuse. The repair process is carried out using a fuse blowing process of applying laser energy to a fuse coupled to the defective cell to cut the fuse.

Typically, the fuse is not formed through a separate fabrication process; instead, some parts of a metal line are extended and the extended parts are used as the fuse. In recent times, the metal line is formed of copper (Cu) that has lower resistivity than aluminum (Al) or tungsten (W) to improve signal transmission characteristics, such that the fuse is also formed of copper (Cu).

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention relates to a semiconductor device in which a capping film pattern including a slot is formed over a fuse pattern to prevent a crack from occurring in the capping film pattern, which may prevent defects caused by Cu migration and oxidation.

In accordance with an aspect of the present invention, a semiconductor device includes: first and second fuse patterns formed to be spaced apart from each other by a predetermined distance over a first interlayer insulation film; a second interlayer insulation film disposed between the first and second fuse patterns; and a capping film pattern formed over the first and second fuse patterns and the second interlayer insulation films, and formed to include a slot exposing the second interlayer insulation film.

Each of the first interlayer insulation film and the second interlayer insulation film may include a first oxide material and a second oxide material.

The fuse pattern may include copper.

The capping film pattern may include a nitride film.

The capping film pattern may be formed to cover entire top surface of the first and second fuse patterns and some parts of a top surface of the second interlayer insulation film.

A length of the capping film pattern may be between 2.5 and 3.5 times a length of the first and second fuse patterns.

Middle portions of the first and second fuse patterns are blowing regions.

A long-axis length of the slot may be longer than a long-axis length of the blowing region of the fuse patterns, and may be shorter than a long-axis length of the first and second fuse patterns.

The semiconductor device may further include: a third interlayer insulation film including an open region exposing a top surface of the capping film pattern and the exposed portion of the second interlayer insulation film.

In accordance with another aspect of the present invention, a method for manufacturing a semiconductor device includes: forming a first interlayer insulation film over a semiconductor substrate; forming first and second fuse patterns spaced apart from each other by portions of a second interlayer insulation film formed over the first interlayer insulation film; forming a capping film over the first and second fuse patterns and the second interlayer insulation film; forming a capping film pattern; and forming a slot in the capping film pattern by etching a portion of the capping film disposed between the first and second fuse patterns.

The first interlayer insulation film and the second interlayer insulation film may include a first oxide film and a second oxide film.

The formation of the fuse pattern may include forming a trench defining a fuse region by etching the second interlayer insulation film; depositing a metal layer over the second interlayer insulation film including the trench; and removing the metal material until the second interlayer insulation film is exposed.

The formation of the first and second fuse pattern may include forming a metal layer over the first interlayer insulation film; forming a mask pattern defining the fuse pattern over the metal layer; and etching the metal layer using the mask pattern as an etch mask.

The method may further include: after forming the trench, forming a barrier metal layer at an inner wall of the trench, wherein the metal material includes copper.

In the formation of the capping film, the capping film may include a nitride film.

In the formation of the capping film pattern, a length of the capping film pattern may be between 2.5 and 3.5 times a length of the first and second fuse patterns.

Middle portions of the first and second fuse patterns may be a blowing region.

A long-axis length of the slot may be longer than a long-axis length of the blowing region of the fuse patterns, and may be shorter than a long-axis length of the first and second fuse patterns.

The method may further include: after forming the capping film pattern, forming a third interlayer insulation film over the capping film pattern; and forming an open fuse region exposing a top surface of the capping film pattern and a portion of the second interlayer insulation film exposed by the slot, by etching the third interlayer insulation film.

The method may further include after forming the open fuse region, performing a fuse-blowing process used by applying laser to the open fuse region to cut one of the first and second fuse patterns.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
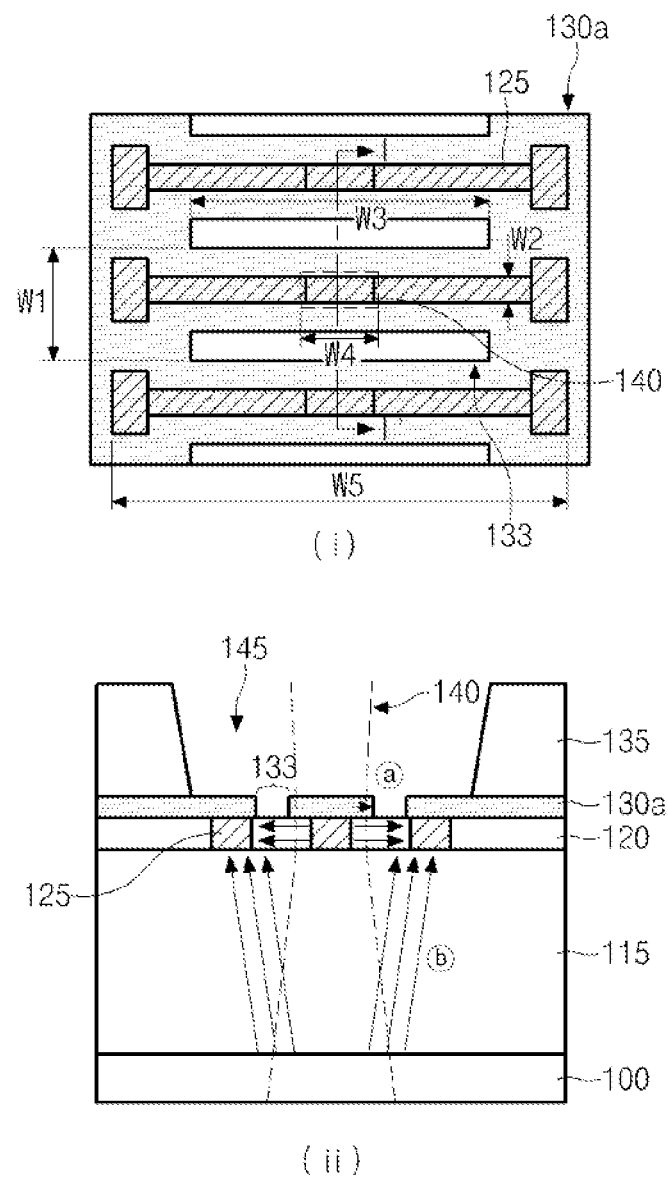
FIG. 1 is a plan view and a cross-sectional view illustrating a semiconductor device according to the present invention.

FIG. 1 illustrates a semiconductor device according to an embodiment of the present invention. In more detail, FIG. 1(*i*) is a plan view illustrating the semiconductor device, and FIG. 1(*ii*) is a cross-sectional view illustrating the semiconductor device taken along the line I-I' of FIG. 1(*i*).

Referring to FIG. 1, a first interlayer insulation film 115 and a second interlayer insulation film 120 are formed over the semiconductor substrate 100, and fuse patterns 125 are spaced apart from each other by a predetermined distance within the second interlayer insulation film 120. In an embodiment, each of the first interlayer insulation film 115 and the second interlayer insulation film 120 may be formed of a laser-transmission material, for example, an oxide material. Each fuse pattern 125 may be formed as a bar shape, and the middle part of each bar shape is a blowing region.

A capping film pattern 130*a* including a slot 133 exposing some parts of the second interlayer insulation film 120 is formed over the second interlayer insulation film 120. The capping film pattern 130*a* is formed to cover not only an upper part of the fuse pattern 125 but also some upper parts of the second interlayer insulation film 120. In an embodiment, a critical dimension CD (length) (W1) of the capping film 130*a* between slots 133 may be between 2.5 and 3.5 times the critical dimension CD (W1) of the fuse pattern 125. In addition, a long-axis CD (W3) of the slot 133 may be longer than a long-axis CD (W4) of the blowing region 140 of the fuse patterns 125, and may be shorter than the long-axis CD (W5) of the fuse patterns 125.

In addition, the semiconductor device may further include a third interlayer insulation film 135 including an open fuse region 145 that exposes the top surface of the capping film pattern 130*a* and some parts of the second interlayer insulation film 120.

A fuse blowing process for cutting a fuse by applying laser to the open fuse region 145 is carried out for the above-mentioned fuse structure. In an embodiment, the laser applied to the open fuse region 145 may use short-wavelength laser (e.g., a green laser having a wavelength (λ) of 500 nm~570 nm). However, the scope or spirit of the present invention is not limited only to the green laser, and other embodiments may apply other lasers.

Laser energy applied to the open fuse region 145 passes through the first interlayer insulation film 115 below the corresponding fuse pattern 125, and some parts of laser energy are reflected from the semiconductor substrate 100, as shown in "ⓑ" of FIG. 1. The reflected laser energy is emitted through the slot 133 contained in the capping film pattern 130*a*, so that it can prevent stress from being applied to the capping film pattern 130*a*. In other words, the slot 133 of the capping film 130*a* may act as a stress buffer, so that it prevents cracks from being generated in the capping film pattern 130*a*. In addition, slot 133 may prevent reflected laser energy from being trapped under capping layer 130*a*.

In addition, the capping film pattern 130*a* including the slot 133 is formed over the fuse pattern 125, such that laser energy reflected from a lower part of the fuse pattern 125 is prevented from being applied to a contiguous fuse pattern (See the part ⓐ of FIG. 1(*ii*)).

FIGS. 2A to 2E illustrate a plan view and a cross-sectional view of a semiconductor device and a method for manufacturing the same according to embodiments of the present invention. In more detail, FIGS. 2A to 2E are cross-sectional views illustrating the semiconductor device taken along the line I-I' of FIG. 1(*i*).

Figure 2A:
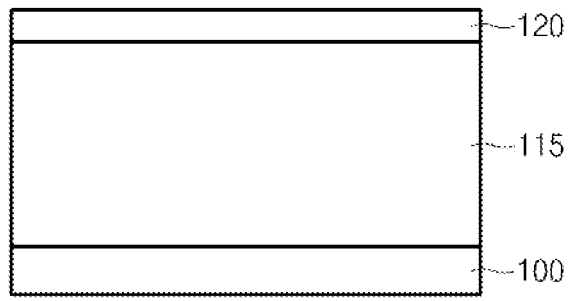
FIGS. 2A to 2E are cross-sectional views illustrating a semiconductor device and a method for manufacturing the same according to embodiments of the present invention.

Referring to FIG. 2A, a first interlayer insulation film 115 is formed over the semiconductor substrate 100. The first interlayer insulation film 115 may be formed of an oxide film serving as a laser-transmission material.

Figure 2B:
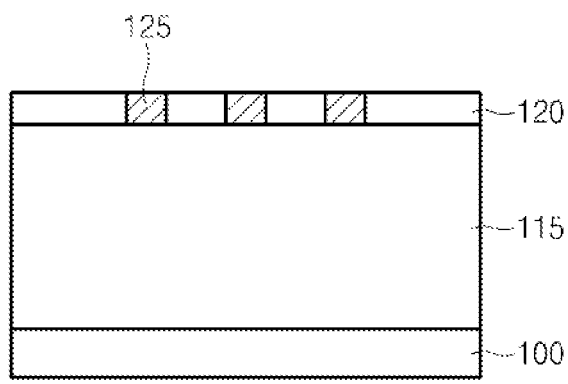

Referring to FIG. 2B, the fuse patterns 125 are spaced apart from each other by a predetermined distance in a second interlayer insulation film 120 formed over the first interlayer insulation film 115.

The fuse pattern 125 may be formed of any of various materials capable of being easily patterned according to a variety of embodiments of the present invention. For example, in an embodiment where each fuse pattern 125 is formed of a material capable of being easily patterned, after a metal layer is formed over the first interlayer insulation film 115, a mask pattern (not shown) defining each fuse pattern 125 may be formed, and the metal layer is etched using the mask pattern as a mask, such that the resultant fuse patterns 125 are defined.

However, in an embodiment where each fuse pattern 125 is formed of a material incapable of being easily patterned, for example, a copper (Cu) material, after a second interlayer insulation film 120 is formed over the first interlayer insulation film 115, a mask pattern (not shown) defining the fuse region may be formed over the second interlayer insulation film 120. Thereafter, the second interlayer insulation film 120 is etched using the mask pattern (not shown) as an etch mask such that a trench exposing the first interlayer insulation film 115 is formed. In addition, the mask pattern (not shown) is removed.

Subsequently, a barrier metal layer (not shown) is deposited over an exposed surface of the trench. The barrier metal layer (not shown) may include titanium (Ti), tantalum (Ta), or a combination thereof. A metal layer is deposited over the second interlayer insulation film 120 including the trench. A planarization process such as chemical mechanical polishing (CMP) may be performed on the metal layer until the second interlayer insulation film 120 is exposed, such that the fuse pattern 125 in which the metal layer is buried in the trench is formed. Each of the fuse patterns 125 is formed as a bar shape as can be seen from the plan view, and the fuse patterns 125 are spaced apart from each other by a predetermined distance. A middle portion of the fuse pattern 125 is a blowing region.

Figure 2C:
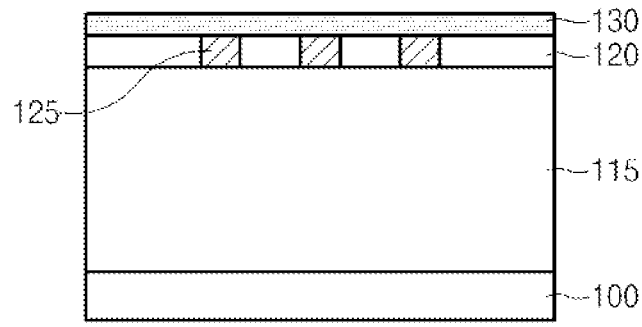

Referring to FIG. 2C, a capping film 130 is formed over the surface of the semiconductor device including the second interlayer insulation film 120 and the fuse patterns 125. The capping film 130 prevents diffusion of the copper ions of the fuse patterns 125. In an embodiment, the capping film 130 may be formed of a nitride film.

Figure 2D:
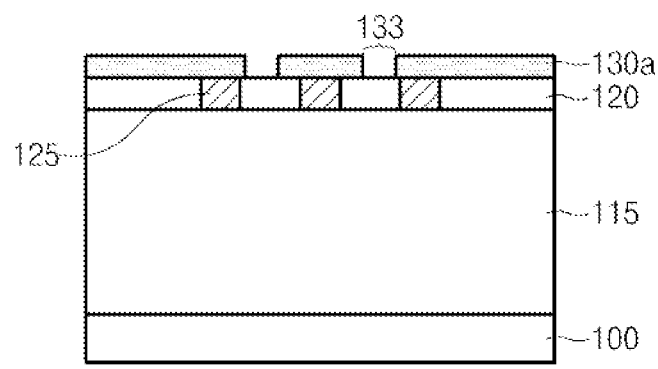

Referring to FIG. 2D, a mask pattern (not shown) is formed over the capping film 130. The capping film 130 is etched using the mask pattern (not shown) as an etch mask, such that the capping film pattern 130a including the slot 133 is formed. The mask pattern (not shown) is then removed.

The capping film pattern 130a including the slot 133 may be formed as shown in FIG. 1(i). The capping film pattern 130a may cover not only the entire upper surface of the fuse pattern 125 but also some parts of the top surface of the second interlayer insulation film 120. A critical dimension CD (W1) of the capping film pattern 130a disposed between the slots 133 may be between 2.5 and 3.5 times the CD (W2) of the fuse pattern 125. In addition, a long-axis CD (W3) of the slot 133 is longer than a long-axis CD (W4) of the blowing region 140 of the fuse patterns 125, and is shorter than a long-axis CD (W5) of the fuse patterns 125.

Figure 2E:
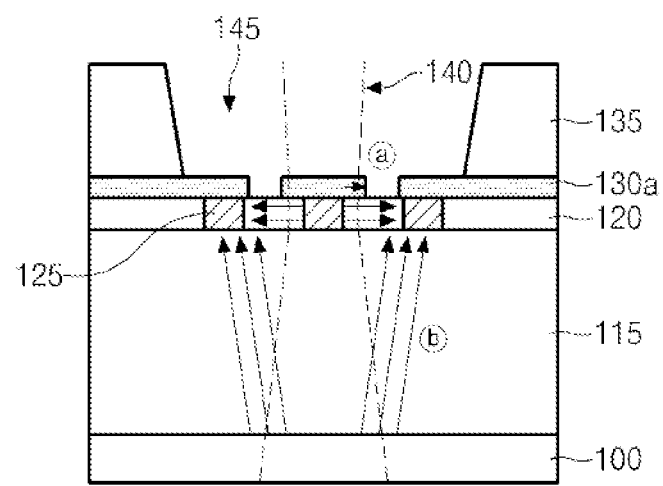

Referring to FIG. 2E, a third interlayer insulation film 135 is formed over the capping film pattern 130a. The third interlayer insulation film 135 may be formed of the same material as the first interlayer insulation film 115 or the second interlayer insulation film 120. For example, the third interlayer insulation film 135 may be formed of an oxide film.

Thereafter, the third interlayer insulation film 135 is etched such that an open fuse region 145 exposing not only the top surface of the capping film pattern 130a but also some parts of the second interlayer insulation film 120 is formed.

A fuse blowing process is performed on the above-mentioned fuse structure, such that laser energy is applied to the open fuse region 145 and the corresponding fuse is blown or cut. In an embodiment, the laser applied to the open fuse region 145 may be a short-wavelength laser, for example, green laser having a wavelength ($\lambda$: 500 nm to 570 nm). However, the scope or spirit of the present invention is not limited thereto, and other embodiments may apply other lasers.

The laser applied to the fuse region 145 passes through the first interlayer insulation film 115 formed below the corresponding fuse pattern 125, and some parts of laser energy are reflected from the semiconductor substrate 100. The reflected laser energy is emitted through the slot 133 contained in the capping film pattern 130a, so that it can prevent the occurrence of stress that has been applied to the capping film pattern 130a according to the related art. In other words, the slot 133 contained in the capping film pattern 130a is used as a stress buffer, such that it can prevent a defective part caused by a crack from being generated in the capping film pattern 130a.

In addition, the capping film pattern 130a including the slot 133 is formed over the fuse pattern 125, such that it can prevent laser energy reflected from a lower part of the fuse pattern 125 from being applied to a contiguous fuse pattern.

As is apparent from the above description, an embodiment of the semiconductor device and the method for manufacturing according to the present invention may have one or more of the following features and effects. In a semiconductor device, a capping film pattern including a slot may be formed over a fuse pattern to prevent a crack from occurring in the capping film pattern to prevent defects due to copper migration and oxidation.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A method for manufacturing a semiconductor device comprising:
   forming a first interlayer insulation film over a semiconductor substrate;
   forming first and second fuse patterns extended in a first direction in portions of a second interlayer insulation film formed over the first interlayer insulation film, wherein the first and second fuse patterns are spaced apart from each other in a second direction perpendicular to the first direction;
   forming a capping film over the first and second fuse patterns and the second interlayer insulation film; and
   forming a plurality of slots in the capping film by etching a portion of the capping film disposed between the first and second fuse patterns, wherein each slot of the plurality of slots is disposed between respective adjacent fuse patterns.

2. The method according to claim 1, wherein the first interlayer insulation film includes a first oxide material and the second interlayer insulation film includes a second oxide material.

3. The method according to claim 1, wherein the step of forming the first and second fuse patterns includes:
   forming a trench defining a fuse region by etching the second interlayer insulation film;
   depositing a metal material over the second interlayer insulation film including the trench; and
   removing the metal material until the second interlayer insulation film is exposed.

4. The method according to claim 3, further comprising:
   after forming the trench, forming a barrier metal layer over an exposed surface of the trench, wherein the metal material includes copper.

5. The method according to claim 1, wherein the step of forming the first and second fuse patterns includes:
   forming a metal layer over the first interlayer insulation film;
   forming a mask pattern defining the first and second fuse patterns over the metal layer; and
   etching the metal layer using the mask pattern as an etch mask.

6. The method according to claim 1, wherein the capping film includes a nitride film.

7. The method according to claim 1, further comprising forming a second slot at an interval from a first slot between 2.5 and 3.5 times a length of the first and second fuse patterns.

8. The method according to claim 1, wherein middle portions of the first and second fuse patterns are blowing regions.

9. The method according to claim 8, wherein a long-axis length of each slot of the plurality of slots is longer than a long-axis length of the blowing region of the fuse patterns, and is shorter than a long-axis length of the first and second fuse patterns.

10. The method according to claim 1, further comprising:
after forming the plurality of slots,
forming a third interlayer insulation film over the capping film; and
forming an open fuse region exposing a top surface of the capping film and a portion of the second interlayer insulation film exposed by the slot, by etching the third interlayer insulation film.

11. The method according to claim 10, further comprising:
after forming the open fuse region,
performing a fuse-blowing process by applying laser to the open fuse region to cut one of the first and second fuse patterns.

12. The method of claim 1, wherein a portion of the capping film remains over the first and second fuse patterns after forming a slot between the first and second fuse patterns.

13. The method of claim 1, wherein a width of a slot of the plurality of slots is disposed between the first and second fuse patterns, and the first fuse pattern is adjacent to the second fuse pattern.

14. The method of claim 1, further comprising:
forming a third interlayer insulation film over the capping film including the plurality of slots; and
forming an open fuse region exposing a top surface of the capping film and a portion of the second interlayer insulation film exposed by the plurality of slots, by etching the third interlayer insulation film.

15. The method of claim 14, wherein the open fuse region is formed over the first and second fuse patterns.

16. A method for manufacturing a semiconductor device comprising:
forming a first interlayer insulation film over a semiconductor substrate;
forming first and second fuse patterns spaced apart from each other by portions of a second interlayer insulation film formed over the first interlayer insulation film;
forming a capping film over the first and second fuse patterns and the second interlayer insulation film; and
forming a slot in the capping film by etching a portion of the capping film disposed between the first and second fuse patterns,
wherein middle portions of the first and second fuse patterns are blowing regions, and
wherein a long-axis length of the slot is longer than a long-axis length of the blowing region of the fuse patterns, and is shorter than a long-axis length of the first and second fuse patterns.

* * * * *